United States Patent [19]

Sasaki et al.

[11] Patent Number: 4,684,553

[45] Date of Patent: Aug. 4, 1987

[54] TRANSPARENT PLASTIC CAN

[75] Inventors: Hitoshi Sasaki; Shoji Igota, both of Kawasaki, Japan

[73] Assignee: Ajinomoto Co., Inc., Tokyo, Japan

[21] Appl. No.: 814,502

[22] Filed: Dec. 30, 1985

[30] Foreign Application Priority Data

Dec. 30, 1984 [JP]  Japan ................. 59-280702

[51] Int. Cl.$^4$ ................. B65D 23/02; B32B 17/10
[52] U.S. Cl. ................. 428/35; 428/430; 428/441; 428/451; 428/483; 220/457
[58] Field of Search ............ 428/35, 430, 441, 451, 428/483; 427/40; 220/457

[56] References Cited

U.S. PATENT DOCUMENTS

4,478,874 10/1984 Hahn ................. 427/40
4,552,791 11/1985 Hahn ................. 428/35

Primary Examiner—John E. Kittle
Assistant Examiner—James J. Seidleck
Attorney, Agent, or Firm—Oblon, Fisher, Spivak, McClelland & Maier

[57] ABSTRACT

A transparent plastic can which comprises a transparent body formed of a laminated plastic structure, the inner surface of which is coated with a thin layer of silicon oxide.

8 Claims, 7 Drawing Figures

TRANSPARENT PLASTIC CAN

BACKGROUND OF THE INVENTION

1. Field of the Invention

The present invention relates to a plastic can which is used as a container for food and drink.

2. Description of the Background:

Metal cans have conventionally been used as containers for food and drink. Recently plastic cans, plastic bottles, and plastic cups, have realized increasing use in the handling and storage of food and drink items because of their ease of production and disposal and because of their low cost. The plastic containers are now available in many varied forms because they can be easily prepared by injection molding, blow molding, and vacuum forming techniques. These containers are used for the handling and storage of a large variety of foods and drinks including edible oils, seasonings, and desserts.

In the past there has been significant activity in the development of food and drink handling containers, as is evident from the following list of patent applications: Japanese Patent Laid-open Nos. 11146/1983, 153629/1983, and 209561/1983, and Japanese Utility Laid-open Nos. 35315/1984 and 35333/1984. The containers described are plastic cans which usually have a can body made of laminated material. The cans meets different requirements depending on the particular application of the container. Plastic cans for foods and drinks are required to conform to food sanitation laws and must have such properties as water resistance, oil resistance, retortability, self-supporting, and gas barrier properties.

Figure 4:
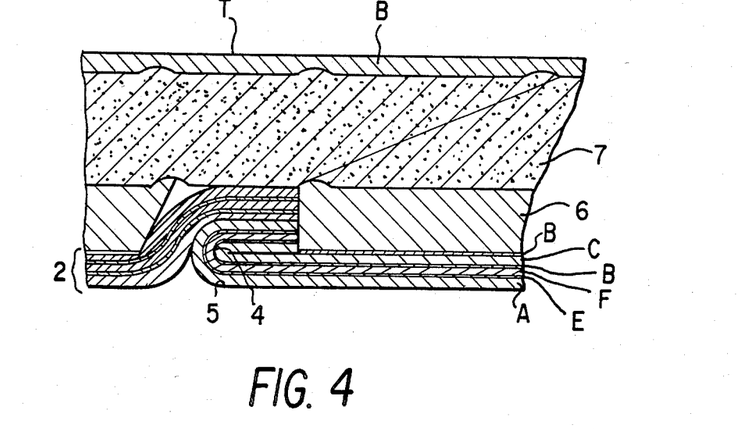
FIG. 4 is an enlarged sectional view of a conventional plastic can body.

The can body of conventional plastic cans is illustrated by the partly enlarged sectional view of FIG. 4. (See, for example, Japanese Patent Laid-open No. 214627/1984.) In this particular example, cylinder (1') which forms the can body, is made up of a content protecting layer which is the laminated film (2) and a supporting layer. The content protecting layer is composed of the following five layers superposed one over the other as shown in FIG. 4:

A: Undrawn polypropylene layer, (70 $\mu$m thick (innermost layer))

E: Adhesive layer (carboxylic acid-grafted polypropylene, 7 $\mu$m thick)

F: Aluminum foil (9 $\mu$m thick)

G: Undrawn polypropylene layer (30 $\mu$m thick)

One edge (4) of the content protecting layer is folded back on itself and the facing surfaces are bonded together. The edge (5) of the adjacent layer overlaps and is bonded to the folded portion. The supporting layer of the can is made of the following four layers which form the laminate of the supporting layer:

B: Urethane adhesive layer (4.5 g/m² (inner layer))

6: Wrapping sheet of undrawn polypropylene (200 $\mu$m thick) (This layer fills the hollow portion between the ridges formed by folding and overlapping the edges of the content protecting layer)

7: Intermediate plastic layer (About 600 $\mu$m thick, made of a 1:1 mixture of polypropylene and calcium carbonate.)

8: Top coating layer (10 to 20 $\mu$m thick, made of polypropylene block copolymer.)

The transparent food and drink containers which are in current use generally are mostly of a single-layered structure formed from a clear plastic such as polyester, polypropylene, and polystyrene. These containers, however, have poor gas barrier properties and do not preserve foods and drinks for long periods of time. In an attempt to improve the gas barrier properties of these materials, it has been proposed to form the container of a multi-layer structure, with a polyvinyl alcohol layer being interposed between two polypropylene layers. This type of container has the drawback that polyvinyl alcohol loses its gas barrier properties upon moisture absorption. Thus, it is not suitable for long-term storage of water containing foods and sterilized foods.

In another embodiment of conventional plastic cans, the can body incorporates a layer of aluminum foil, which is necessary for gas barrier properties, and a layer of a polypropylene-calcium carbonate mixture. This type of can has an opaque body which obscures the contents of the can. Opaque cans are undesirable containers for those products which must appeal to the consumer's eye. In addition, the conventional plastic cans can not be heated by an electronic oven because the aluminum foil layer reflects the microwave radiation. A need therefore continues to exist for a food and drink, storage and handling container which obviates the above-stated difficulties of conventional containers.

SUMMARY OF THE INVENTION

Accordingly, one object of the present invention is to provide a plastic food and drink container which has good gas barrier properties and which is not opaque in appearance.

Briefly, this object and other objects of the present invention as hereinafter will become more readily apparent can be attained by a transparent plastic can which comprises a transparent body formed of a laminated plastic structure, the inner surface of which is coated with a thin layer of silicon oxide.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The central feature of the present invention is a container, the body of which is formed of a transparent laminate, upon which is deposited or sputtered a layer of silicon oxide. The silicon oxide may be either silicon monoxide or silicon dioxide. The two silicon materials may be used individually or in combination with each other.

The substrate onto which the silicon oxide material is coated, which forms the body of the container includes the likes of biaxially oriented polypropylene film, polyester film, biaxially oriented nylon film, polycarbonate film and polystyrene film.

The deposition or sputtering of silicon oxide on the substrate may be accomplished by any known method. The silicon oxide layer which is formed should be thick enough so that the product has sufficient gas barrier properties. The thickness of the silicon oxide layer is usually 200 Å and above, preferably 500 Å to 2000 Å.

Normally, the use of one silicon oxide layer is sufficient to obtain a satisfactory product. However, two or more silicon oxide layers may be formed, if desired or necessary. The silicon oxide layer should be an internal layer rather than an outer layer in the laminate.

The other layers of the laminated structure of the container body are selected with a view to the properties desired for a particular use of the container or can. For example, the laminate should have an innermost polyolefin layer when it is intended to store food or drinks in the can. The outer layer of conventional cans is made of a polypropylene-calcium carbonate mixture. In the practice of the present invention however, this outer layer is a transparent polypropylene layer.

Figure 1:
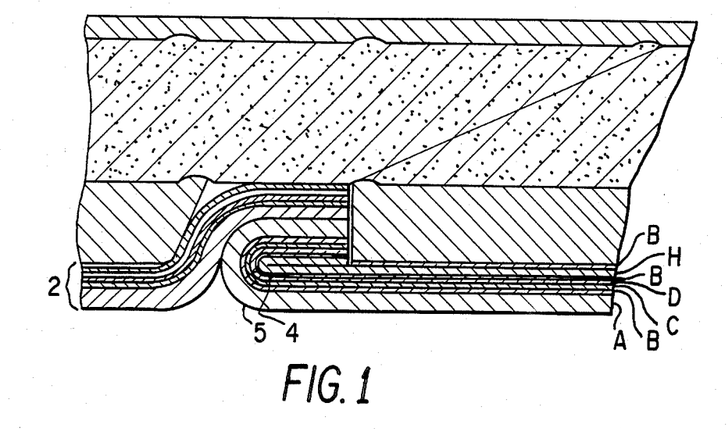
FIG. 1 is an enlarged sectional view of a portion of the plastic can body produced by the procedure described in Example 1.

In forming a cylinder preparatory to manufacturing a completed can structure by joining the edges of laminated film which constitute the content protecting layer of the product can, one edge (4) of the laminate film (2) is folded back and the other edge (5) overlaps the folded portion. The contacting edges are then bonded, as shown in FIG. 1, so that this section of the laminated film does not come into contact with the contents of the can. The joint thus formed may be spiral or straight in the longitudinal direction.

The silicon oxide layer formed by vacuum evaportion or sputtering provides the product container with good gas barrier properties, even when watery foods and sterilized foods are stored therein. The product container of the present invention therefore provides for effective food preservation for long periods of time. In addition, the silicon oxide layer is transparent to both visible light and microwave energy.

Having generally described this invention, a further understanding can be obtained by reference to certain specific examples which are provided herein for purposes of illustration only and are not intended to be limiting unless otherwise specified.

EXAMPLE 1

A three-layered laminated film was produced from a 25 μm thick biaxially oriented polypropylene film having a silicon oxide layer vacuum evaporated thereon to a thickness of 1000 Å, a 70-μm thick undrawn polypropylene film, and a 30-μm thick undrawn polypropylene film. The films of the laminate were bonded to each other in the order mentioned with a urethane adhesive in an amount of 4.5 g/m². (The surface of the film bearing the silicon oxide layer was placed inside.)

Figure 3:
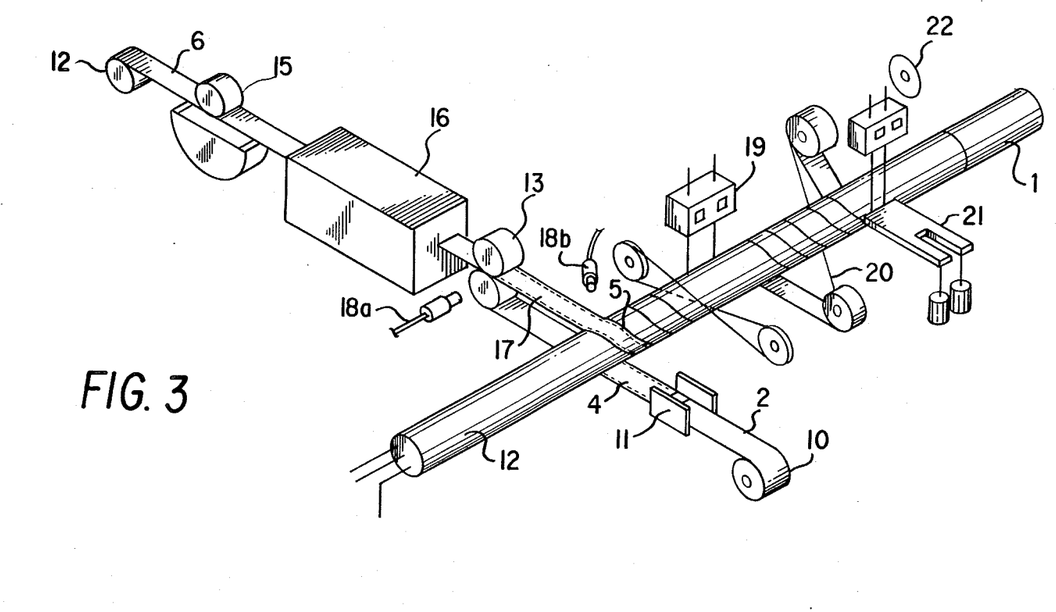
FIG. 3 is a schematic view of an apparatus employed to manufacture the body of the plastic can described in Example 1.

The laminated film was made into a can body (1) using the apparatus schematically shown in FIG. 3. The process employed to make the can body is as follows:

The laminated film (2) fed from the stock roll (10) passes through the edge folding unit (11) that folds back one edge (4) of the laminated film (2). The film then passes under the mandrel (12) and reaches the pressing roll (13). On the other hand, the wrapping sheet (6), fed from the stock roll (14), is coated (on one side) with an adhesive by the adhesive applicator (15), followed by drying with hot-air dryer (16). The wrapping sheet (6) is bonded to the laminated film (2) by the pressing roll (13). The laminated sheet (17), thus formed is wound around the mandrel (12). The overlapped edges (4, 5) of the laminated film (2) are bonded together by heat from air heater (18). The laminated sheet (17), which is wound around the mandrel, is then covered with molten plastic extruded from the T-die (19). The molten plastic is smoothened by smoothening belt (20), which results in the formation of intermediate plastic layer (7). The intermediate plastic layer (7) is further covered with molten plastic applied by doctor knife (21), which results in the formation of top coating layer (8). The cylinder leaving the mandrel is cut to length by the cutter (22).

Figure 2:
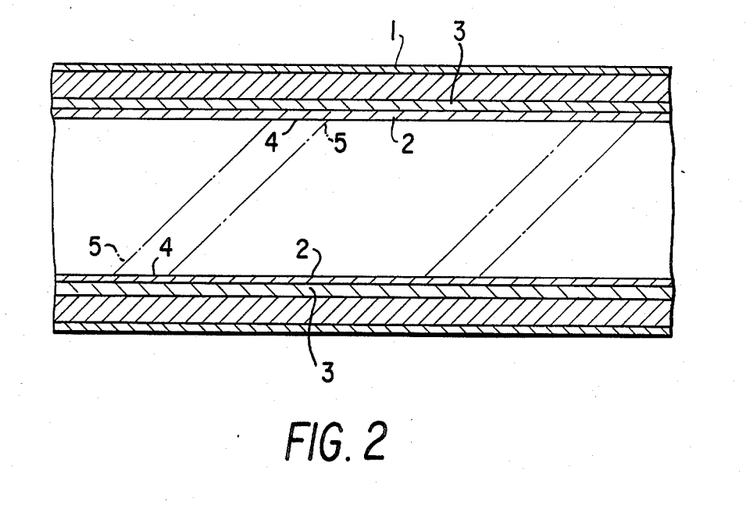
FIG. 2 is a longitudinal sectional view of the plastic can body produced by the procedure described in Example 1.

The can body produced as mentioned above has the structure shown in FIG. 1 (enlarged sectional view) and in FIG. 2 (longitudinal sectional view). The content protecting layer of the laminated film (2) is made up to 70-μm thick, undrawn, polypropylene layer (A), urethane adhesive layer, 4.5 gm/m², (B), 1000 Å thick silicon monoxide deposited film layer (C), 25-μm thick biaxially oriented polypropylene layer (D), urethane adhesive layer, 4.5 g/m² (B), and 30-μm thick, undrawn, polypropylene layer (H). The laminated film (2) is spirally wound into a cylinder in such a manner that one edge (4) of the laminated film (2) is folded back and bonded and the other edge (5) overlaps the folded part, followed by bonding. The supporting layer (3) placed outside the content protecting layer has a structure similar to that of the conventional can body shown in FIG. 4; but the layer of polypropylene-calcium carbonate mixture is replaced by 100% polypropylene.

The can body described above was provided with injection molded plastic can lids to complete fabrication of the can. The can was transparent and the contents were visible. The can had good gas barrier properties and was capable of being heated in an electronic oven.

EXAMPLE 2

Figure 5:
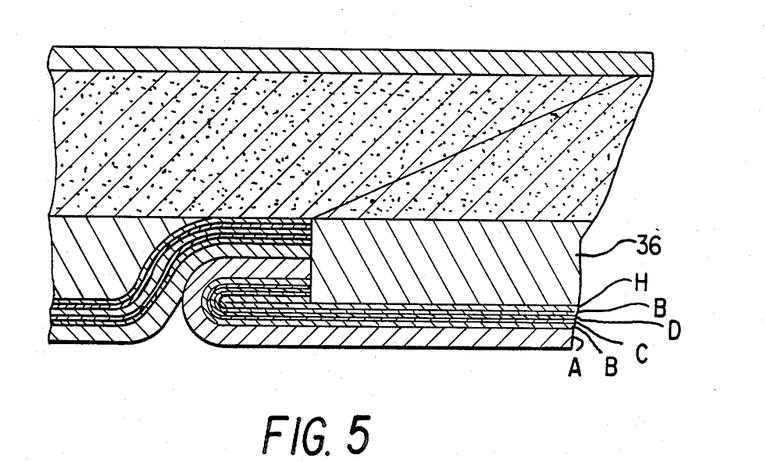
FIG. 5 is an enlarged sectional view of a portion of the plastic can body produced by the procedure described in Example 2.
Figure 6:
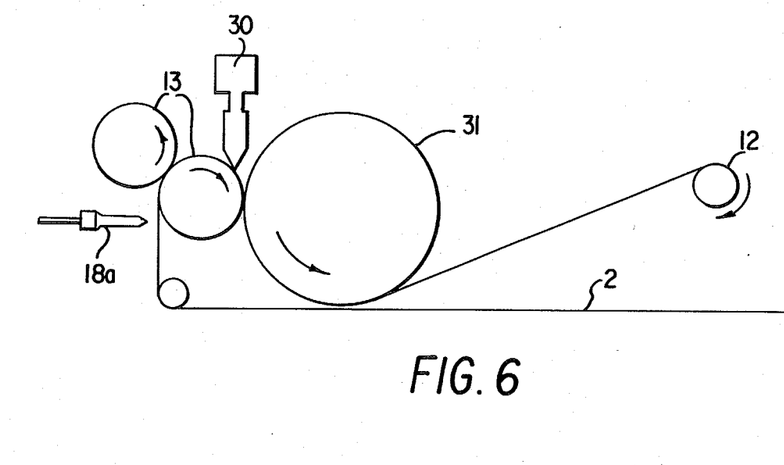
FIG. 6 is a partial side view of an apparatus for applying a melt extruded plastic layer.
Figure 7:
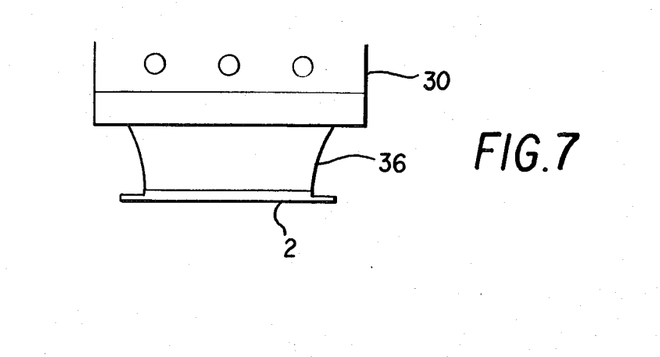
FIG. 7 is a schematic front view illustrating the molten plastic layer in a state of being extruded.

A can body was produced in the same manner as described in Example 1, except that the biaxially oriented polypropylene film was replaced by a 12-μm thick polyethylene terephthalate film and except that a melt extruded polypropylene layer 36 is used in the place of a deposited sheet 6. This apparatus for the production of the tube is basically the same as the apparatus which is schematically illustrated in FIG. 3, except that the parts pertaining to the deposited sheet 6, i.e., stock roll 14, sizing device 15, and hot air drier 16 shown in FIG. 3, are no longer used. In their place, the device illustrated in FIG. 6 is installed. In the apparatus of FIG. 6, a T-die 30 is positioned over a portion of a press roll 13 and a cooling roll 31 is positioned opposite to press roll 13 across an intervening space three times the thickness of the laminated film. The laminated film 2 having one lateral edge thereof folded back by the edge-folding device is brought in from the right-hand side of FIG. 6. The folded portion is heated by a cartridge air heater 18a and then pressed down into fast union by the press roll 13. Via the T-die 30, the molten plastic 36 is extruded in a prescribed width and applied on the laminated film 2 as illustrated in FIG. 7. The applied molten plastic is cooled by cooling roll 31, rolled to an even thickness, and forwarded to the mandrel 12. Thereafter, the laminated film and the applied plastic are treated as illustrated in FIG. 3 to complete a tube for a can barrel. The can body produced as above has the structure shown in FIG. 5 (enlarged sectional view). The can body was provided with metal can lids to complete fabrication of the can. As in Example 1, the can was transparent and the contents were visible. The can had good gas barrier properties and was capable of being heated in a microwave oven.

EXAMPLE 3

The plastic cans prepared as described in Examples 1 and 2 were examined for their performance in a field test. For comparison, containers of approximately the same size, which were constructed of single layer of polypropylene, were also examined in the same manner.

Sample of the cans of the present invention were filled with various types of cooked foods as shown in Table 1. The cans were then sterilized with hot water at 125° C. The taste of the foods was evaluated by an organoleptic test immediately after sterilization and 12 months after preservation in a room kept at a temperature of 20° to 30° C. (Before the test, the foods were heated using a microwave oven.) The organoleptic test was conducted by 10 panelists. The test results are indicated by the point system shown below for each quality of appearance, flavor, taste, texture, and odor. The criteria for the point system are as follows:

5.0 ... Excellent
4.0 ... Good
3.0 ... Fair (acceptable as a commercial product)
2.0 to 1.0 ... Poor (no commercial value)
0 ... Inedible

TABLE 1

Food Preservation In Plastic Cans Of The Invention And Polypropylene Cans

| | | | Just after sterilization | | | | After preservation for 12 months | | | | | |
| | | | PP cans | | Cans of Invention | | Polypropylene cans | | | Cans of the invention | | |
| Type of Food | Raw Materials | Sterilization | Point | Color | Point | Color | Point | Color | Others | Point | Color | Others |
| --- | --- | --- | --- | --- | --- | --- | --- | --- | --- | --- | --- | --- |
| 1. Short-neck clam boiled in plain water (as food material) | Short-neck clam, salt | 50 min | 5.0 | Good | 5.0 | Good | 1.0 | Browning | Flavor and taste deteriorated; no commercial value | 4.0 | Slightly brown | Taste slightly lost |
| 2. Bamboo Shoots boiled in plain water (as food material) | Bamboo shoot | 65 min | 5.0 | Good | 5.0 | Good | 2.0 | Browning | Unusual taste; poor feeling | 4.3 | Slightly brown | Feeling slightly poor |
| 3. Common mushroom (as food material) | Mushroom, salt, L-ascorbic acid, pH adjustor, seasonings | 50 min | 5.0 | Good | 5.0 | Good | 2.0 | Browning | Unusual taste; poor feeling; no commercial value | 4.5 | Slightly brown | Taste slightly lost |
| 4. Mixed seasonings for Chinese Food (Mabo Nasu) | Soy sauce, Sake, edible oil, tomato catsup, ginger root, seasonings, scallops, beef extract, salt | 40 min | 5.0 | Good | 5.0 | Good | 1.0 | Browning | Taste lost, salty, no commercial value | 4.5 | Slightly brown | Taste slightly lost |
| 5. Mixed seasonings for Borsch | Tomato, red beets, salt, seasonings, spice, meat extract, vegetable extract | 45 min | 5.0 | Good | 5.0 | Good | 1.0 | Tomato browned | Taste lost, unusual taste, taste, no commercial value | 4.3 | Tomato slightly browned | Taste slightly lost |
| 6. Mixed seasonings for Pork curry | Edible oil, milk, wheat flour, sugar, salt, protein hydrolyzate, meat extract, Kaorina | 50 min | 5.0 | Good | 5.0 | Good | 2.0 | Browning | Curry taste lost; no commercial value | 4.5 | Slightly brown | Taste slightly lost |
| 7. Soup (creamed corn) as processed food | Sweet corn, milk, wheat flour, sugar, salt, edible oil, seasonings, protein hydrolyzate, meat extract, spice | 60 min | 5.0 | Good | 5.0 | Good | 1.0 | Browning | Taste lost; unusual flavor; no commercial value | 4.5 | Slightly brown | Corn taste slightly lost |
| 8. "Sankaini" as processed food | Bamboo shoot, tuna flake, elephant | 70 min | 5.0 | Good | 5.0 | Good | 2.0 | Browning | Taste lost; unusual flavor; no commercial | 4.5 | Slightly brown | Taste slightly lost |

TABLE 1-continued

| | | | | | | Just after sterilization | | | | | |
|---|---|---|---|---|---|---|---|---|---|---|---|
| | | | | | | | | After preservation for 12 months | | | |
| | | | | | Cans of | | | | | | |
| | Raw | Sterili- | PP cans | | Invention | | Polypropylene cans | | | Cans of the invention | |
| Type of Food | Materials | zation | Point | Color | Point | Color | Point | Color | Others | Point | Color | Others |
| | food, seasonings | | | | | | | | value | | | |

It can be observed from Table 1 that there is no significant difference between the plastic cans of the present invention and the polypropylene cans when tested immediately after sterilization. However, after storage at room temperature for 12 months, the foods in the polypropylene cans deteriorated to such an extent that they were almost of no commercial value, whereas the plastic cans of the present invention preserved the foods almost intact. No difference was observed between the plastic cans of Example 1 and those of Example 2. The plastic cans of the present invention permit heating of the contents therein with a microwave oven after they are opened.

The present invention provides for a new dimension in the use of plastic cans which can be easily produced at low cost and easily disposed of after use. The plastic can of the present invention exhibits good gas barrier properties, and it preserves watery foods and sterilized foods over long periods of time. The plastic can of the present invention is transparent and makes the contents of the can appealing to the consumer's eye. The can is also transparent to microwave energy. This feature permits the contents of the can to be heated by a microwave oven while the contents are in the can.

Having now fully described the invention, it will be apparent to one of ordinary skill in the art that many changes and modifications can be made thereto without departing from the spirit or scope of the invention as set forth herein.

What is claimed as new and is intended to be secured by letters patent is:

1. A transparent retortable container capable of preserving foods for a long period of time, which comprises:
    a cylindrical body consisting of an inner cylindrical member which serves as the content-protecting layer and an outer coated plastic layer which supports the shape of said container, said inner cylindrical member being constructed of a laminated film consisting of at least three layers of a polyolefin layer, a polyester layer having silicon oxide deposited thereon and a plastic layer, the deposited silicon oxide layer being in contact with the polyolefin layer, said cylindrical body being formed by winding said laminated film around a mandrel, with said polyolefin layer facing inside and with one edge of said laminated film outwardly folded back so that the plastic layer comes into contact and bonds with itself, and joining one edge of the film to said folded edge by overlapping said edge over the folded edge and bonding the overlapped portion.

2. The transparent plastic container of claim 1, wherein said silicon oxide layer is formed by a vacuum evaporation or sputtering operation.

3. The transparent plastic container of claim 1, wherein said silicon oxide layer is at a thickness of at least 200°.

4. The transparent plastic container of claim 3, wherein said silicon oxide layer is of a thickness ranging from 500° A to 2000° A.

5. The transparent plastic container of claim 1, wherein the transparent body of the can renders the contents thereof visible, permits the long term storage of food or beverage and is capable of being heated in a microwave oven.

6. The transparent plastic container of claim 1, wherein said cylindrical body is enclosed by fusion bonding lids thereto.

7. The transparent plastic container of claim 6, wherein said lids are metal can lids or injection molded plastic can lids.

8. The transparent plastic container of claim 1, wherein said silicon oxide is silicon monoxide or silicon dioxide.

* * * * *

UNITED STATES PATENT AND TRADEMARK OFFICE
CERTIFICATE OF CORRECTION

PATENT NO. : 4,684,553
DATED      : August 4, 1987
INVENTOR(S): Hitoshi Sasaki; Shoji Igota It is certified that error appears in the above-identified patent and that said Letters Patent is hereby corrected as shown below:

| Col. | Line |   |
|---|---|---|
| 1 | 13, | delete "disposal" and insert --disposability--, |
|   | 28, | delete "meets" and insert --meet--, |
| 2 | 20, | delete "can not" and insert --cannot--, |
|   | 51, | delete "1," and insert --1;--, |
| 3 | 42, | delete "evaportion" and insert --evaporation--, |
|   | 58, | insert -- - -- after 25, |
| 4 | 28, | delete "gm/m² and insert --g/m²--, |
|   | 31, | insert --,-- after g/m², |
|   | 57, | insert -- - -- after hot, |
|   | 3, | delete "Sample" and insert --Samples--, |
| 6 | Table 1, | column heading "___________ Just after sterilization" over columns 4-7 should read as --Just after sterilization--; under heading "Others" (Column 10 of Table), for No.3 delete "taste," and insert --taste;--, for No.4, delete "salty," and insert --salty;--, |

UNITED STATES PATENT AND TRADEMARK OFFICE
CERTIFICATE OF CORRECTION

PATENT NO. : 4,684,553

DATED : August 4, 1987

INVENTOR(S) : Hitoshi Sasaki; Shoji Igota

It is certified that error appears in the above-identified patent and that said Letters Patent is hereby corrected as shown below:

| Col. | Line |
|---|---|
| 8 | 30, delete "200°" and insert --200 Å--, |
| 8 | 33, delete "500°" and insert --500 Å-- and delete "2000°" and insert --2000 Å--, |

Signed and Sealed this

Twenty-second Day of March, 1988

Attest:

DONALD J. QUIGG

Attesting Officer  Commissioner of Patents and Trademarks